(12) United States Patent
Cerda et al.

(10) Patent No.: US 10,312,933 B1
(45) Date of Patent: Jun. 4, 2019

(54) CHORD MODULATION COMMUNICATION SYSTEM

(71) Applicant: Sprint Spectrum L.P., Overland Park, KS (US)

(72) Inventors: Salvador Cerda, Peculiar, MO (US); Christopher D. Schmitt, Shawnee, KS (US); Stephen D. Williams, Olathe, KS (US); Kenneth W. Samson, Belton, MO (US)

(73) Assignee: Sprint Spectrum L.P., Overland Park, KS (US)

( * ) Notice: Subject to any disclaimer, the term of this patent is extended or adjusted under 35 U.S.C. 154(b) by 223 days.

(21) Appl. No.: 14/156,143

(22) Filed: Jan. 15, 2014

(51) Int. Cl.
*H03M 1/66* (2006.01)

(52) U.S. Cl.
CPC .................. *H03M 1/664* (2013.01)

(58) Field of Classification Search
CPC ............................ H04L 5/0007; H04L 27/30
See application file for complete search history.

(56) References Cited

U.S. PATENT DOCUMENTS

| | | | | |
|---|---|---|---|---|
| 5,583,933 | A * | 12/1996 | Mark | G06Q 20/341 235/380 |
| 5,758,316 | A | 5/1998 | Oikawa et al. | |
| 6,665,350 | B1 * | 12/2003 | Bartkowiak | H04L 27/30 375/275 |
| 6,917,654 | B1 | 7/2005 | Cerda, Jr. | |
| 2002/0093924 | A1 * | 7/2002 | Preston | G01S 5/0027 370/328 |
| 2003/0194082 | A1 * | 10/2003 | Shoval | H04M 1/26 379/399.01 |
| 2004/0024593 | A1 | 2/2004 | Tsuji et al. | |
| 2004/0081078 | A1 * | 4/2004 | McKnight | H04L 27/30 370/210 |
| 2004/0081313 | A1 | 4/2004 | McKnight et al. | |
| 2004/0264713 | A1 | 12/2004 | Grzesek | |
| 2005/0100117 | A1 | 5/2005 | Jensen | |
| 2005/0147057 | A1 | 7/2005 | LaDue | |
| 2008/0304360 | A1 | 12/2008 | Mozer | |
| 2010/0271263 | A1 * | 10/2010 | Moshfeghi | G01S 5/0263 342/378 |
| 2012/0076212 | A1 | 3/2012 | Zeppetelle et al. | |

(Continued)

OTHER PUBLICATIONS

Dutta et al., "Data Hiding in Audio Signal: A Review", International Journal of Database Theory and Application, vol. 2, No. 2, Jun. 2009, pp. 1-8.

*Primary Examiner* — Sung S Ahn

(57) ABSTRACT

A process and corresponding system for encoding and decoding digital data in analog signals is disclosed. Digital data values are represented by concurrent combinations of distinct audio tones, which combine to create chords. The chords have multiple identifiable parameters that can be modulated to represent the data values. For instance, the modulated chords can include a concurrent combination of distinct tones that each have a different frequency and a different starting time. The frequencies of the tones and the starting times of those tones can be modulated to create unique combinations that represent respective data values. As such, analog audio content of a given chord can be used to represent a particular data value and the analog audio signals can be transmitted between nodes in a communication network in order to communicate that data value.

20 Claims, 4 Drawing Sheets

(56) References Cited

U.S. PATENT DOCUMENTS

2014/0108252 A1* 4/2014 Itwaru ............... G06Q 20/202
  705/44
2014/0375228 A1* 12/2014 Tsai ............... H05B 37/0272
  315/291

* cited by examiner

CHORD MODULATION COMMUNICATION SYSTEM

BACKGROUND

Unless otherwise indicated herein, the materials described in this section are not prior art to the claims and are not admitted to be prior art by inclusion in this section.

Digital information can be exchanged between modems over an analog communication link. Typically, each modem may be configured to both: generate a modulated analog signal so as to encode digital data in the signal, and demodulate a received analog signal so as to recover digital data represented by the signal. A modem can therefore function to: (i) receive a data value and output a modulated analog signal that represents the data value, and also (ii) receive a modulated analog signal and output a data value represented by the modulated analog signal.

Some modulation techniques include: frequency modulation, in which bits of digital data are encoded in a signal in accordance with changes in the frequency of the signal; amplitude modulation, in which bits of digital data are encoded in a signal in accordance with variations in the amplitude of the signal; and phase modulation, in which bits of digital data are encoded in a signal in accordance with variations in the phase of the signal.

To send a given data value between modems, a first modem can receive a particular data value for transmission to a second modem. Then, based on the particular data value, the first modem can select an analog signal with certain identifiable parameters. The parameters are selected such that the analog signal having those parameters represents the received data value in accordance with the employed modulation technique. The first modem can then generate an analog signal having the selected parameters. The resulting modulated signal that represents the particular data value can then be mixed with a carrier frequency and transmitted over a wireless or hard-wired communication path to the second modem (perhaps in combination with an associated transmission system). The second modem can receive the signal, convert the received signal to baseband (perhaps in combination with an associated receiver system), and process the signal to identify the modulated parameters. The second modem can then, based on the identified modulated parameters, recover the particular data value and thereby complete the process of communicating the data value. In practice, both modems may have a stored database, or a hardware-implemented equivalent, that associates various data values with respective modulated parameters and thereby allows the modems to perform mappings between data values and modulated parameters.

Various communications systems may use modulated analog signals for conveying digital data over communication links. One such application may involve a cellular wireless network system. A typical cellular wireless network system (wireless communication system) may include a number of base stations with antennas that radiate to define wireless coverage areas, such as cells and cell sectors. Within the wireless coverage areas, a subscriber (or user) accesses the communication services via a wireless communication device (WCD), which can communicate by exchanging radio frequency signals with the base stations. WCDs may include cell phones, tablet computers, tracking devices, embedded wireless modules, and other wirelessly equipped communication devices. In turn, each base station may be coupled with network infrastructure that provides connectivity with one or more communication networks, such as the public switched telephone network (PSTN) and/or a wide area network (WAN) for sending and receiving packet data (the internet, for instance). These (and possibly other) elements function collectively to form a Radio Access Network (RAN) of the wireless communication system. With this arrangement, a WCD within coverage of the RAN may communicate with various remote network entities.

In general, communications on the RAN are carried out in accordance with an air interface protocol that provides procedures for coordinating communications between the base stations and the WCDs. Examples of existing air interface protocols include, without limitation, Code Division Multiple Access (CDMA) (e.g., 1×RTT and 1×EV-DO), Long Term Evolution (LTE), Wireless Interoperability for Microwave Access (WiMAX), Global System for Mobile Communications (GSM), among other examples. Each protocol may define its own procedures for registration of WCDs, initiation of communications, handoff between coverage areas, and other functions related to air interface communication. Similarly, communications between the base station, other network infrastructure, and various communication networks are carried out in accordance with certain protocols as well.

Overview

Disclosed herein is a process and corresponding system for encoding and decoding digital data in analog signals. Digital data values are represented by concurrent combinations of distinct audio tones, which combine to create chords. The chords have multiple identifiable parameters that can be modulated to represent the data values. For instance, each of the distinct tones in a given chord can have a different frequency and a different starting time. The frequencies of the tones and the starting times of those tones can be modulated to create unique combinations that represent respective data values. As such, analog audio content of a given chord can be used to represent a particular data value. The analog audio signals can be transmitted between nodes in a communication network, where the particular data value can be extracted from the chord.

To communicate a given data value from a first node to a second node in a communication network, an encoder at the first node maps the given data value to a particular chord (a concurrent combination of distinct tones). The encoder can then generate audio output of the chord, and the audio output can be transmitted over a communication path, such as a wired or wireless link in which the audio output is sent over a carrier. At the second node, the transmitted signal is received and the audio content extracted, which may involve converting to baseband, filtering, amplifying, or otherwise conditioning the received signal. A decoder at the second node can analyze the audio content and identify the modulated parameters of the chord (e.g., the combination of different frequencies and starting times of each distinct tone in the chord). The decoder then maps the modulated parameters to the digital data value, and thereby completes the communication of the data value from the first node to the second node.

In some examples, additional identifiable parameters of the analog audio content can be modulated to generate additional uniquely identifiable chords that represent data. For example, each of the amplitudes and/or durations of the individual distinct tones in a given chord can be independently modulated to create further variations of possible chords. By using additional, independently modulated parameters, the quantity of uniquely identifiable chords available to be communicated increases. In practice, the amount of data represented by a particular chord (i.e., the combination of modulated parameters in the particular chord) depends on the quantity of unique chords that can be both generated and accurately identified by the communication nodes. That is, the amount of data that can be represented by a particular chord depends on: the number of different tone frequencies, tone starting times, tone amplitudes, and tone durations that can be generated by the encoding node, and also recognized by the decoding node.

Because each of the parameters can be modulated independent of the other parameters, the quantity of uniquely identifiable chords that can be generated (and recognized) scales as the product of the respective numbers of uniquely identifiable values of independently modulated parameters for each tone achievable by the encoders (and decoders), all raised to the power of the number of distinct tones in the chord. For instance, if the system allows for each distinct tone to have one of: 16 possible frequencies, 16 possible amplitudes, and 16 possible durations, then a given tone can represent one of 4096 values (16×16×16). Moreover, in a system in which a given chord can include 3 distinct tones (differentiated by 3 different starting times), then each chord can represent one of about $6.87 \times 10^{10}$ values ($4096^3$). Although the number of possible values is subject to some reduction if certain limitations are enforced, such as requiring that each distinct tone have a different frequency, in which case the tone frequencies are not mutually independent because the "second" distinct tone is selected from one of 15 possible frequencies, and the third can have one of 14 possible frequencies.

To generate chords having particular modulated parameters, the encoder can include a tone generator, synthesizer, waveform generator, or similar module that is configured to generate analog electrical signals with specified frequencies in the audio range and at specified starting times (and perhaps with specified amplitudes and/or durations). The tone generator may be an electronically controlled module which generates a waveform of audio signals with specified parameters using a combination of voltage controlled oscillators, filters, amplifiers, timers, etc. Moreover, the tone generator may incorporate one or more individual distinct tone generators, which can be hardware-implemented modules that create audio tones using instruments (e.g., devices configured to induce resonant vibrations at audio frequencies via cavities, strings, etc.). The resulting audio tones can be converted to corresponding analog electrical signals via suitable transducers.

Once generated, the analog signals can then be transmitted over a communication channel. The communication channel may be a wireless or wired communication link in which the audio signals is sent over a carrier frequency on a radiative or conductive path. In some cases the communication channel may be a sonic communication link in which the audio signals propagate as sound waves through a medium, such as in air or another fluid, or in another medium capable of transmitting sound waves.

To detect particular parameters in a received chord, the decoder can include a receiver configured to recover the audio content from a received signal. For instance, the receiver may convert incoming signals to baseband via an arrangement of one or more mixers, filters, and/or amplifiers. The baseband signal of the audio content can then be sampled and analyzed via digital signal processing techniques, for example. The modulated parameters can be identified through such analysis. For example, the frequency content of the audio content can be analyzed to identify which tone frequencies are included in the chord, and the respective starting times of each tone can be identified based on the time at which each frequency is first measured. In addition, the average power at each frequency, or another measure of signal strength, can be used to estimate the amplitude of each tone, and the time at which each frequency ceases to be detected can be used to estimate the duration of each tone.

Alternatively, or perhaps in addition, one or more hardware-implemented modules may be used to identify particular tone frequencies, starting times, amplitudes, durations, and the like. For instance, the baseband signal can be passed through a bank of narrowband filters, each having a bandwidth corresponding to a possible tone frequency. The output of each filter can then be analyzed to determine which tone frequencies are included in a received chord. The power and timing of the signals output at each frequency can also be analyzed to determine the starting times, durations, and/or amplitudes of the tones. Upon identifying the modulated parameters of the chord, the decoder can use the modulated parameters to map the chord to the originally encoded data value.

In some cases, both the encoder and decoder can each maintain correlation data that associates digital data values with particular chords. For example, a lookup table (or another data structure) that associates each of various data values to a particular chord characterized by a unique combination of modulated parameters (e.g., tone frequencies, tone starting times, tone amplitudes, and/or tone durations). The encoder and decoder can then refer to the correlation data to associate a given data value to a chord with a particular set of modulated parameters and vice versa.

In some cases, a reference tone can be transmitted simultaneously with the modulated chord and used as a basis for comparison in determining the amplitudes of the tones in the chord. For instance, the reference tone can have a reserved frequency used solely for the reference tone and can have a standard amplitude. In the decoder, the amplitude of the reference tone can then be used to calibrate for noise or other signal degrading factors caused by transmission over the communication channel. For example, the decoder may determine the amplitude of each distinct tone in the chord, relative to the amplitude of the reference tone. The amplitudes of the tones in the chord can be measured as a fraction of the reference tone amplitude. Because both the reference tone and the modulated chord are transmitted over the same communication channel, the effects from noise and the like act on both similarly and so the proportionate measure of tone amplitudes, relative to the reference tone, can be substantially uninfluenced by noise.

In addition, such a reference tone can be used to indicate the initiation of a chord transmission (e.g., to alert a receiver/decoder that a chord is incoming). The timing of the initial receipt of the reference tone can also be used as a reference from which tone starting times and/or durations can be measured. This technique may help reduce potential uncertainties in estimating the time-sensitive modulated parameters because the reference tone may be transmitted with a relatively large amplitude (e.g., the reference tone may define the maximum tone amplitude) and so the starting time of the reference tone may be ascertained with relatively greater precision than, for example, a tone transmitted with minimum amplitude.

Accordingly, in one respect, a method is disclosed. The method can include receiving a data value for transmission to an endpoint. The method can include selecting a particular concurrent combination of a plurality of distinct tones based on the received data value. Each distinct tone in the plurality of distinct tones can have a respective frequency that is different than that of each other distinct tone, and each distinct tone in the plurality of distinct tones can have a respective starting time that is different than that of each other distinct tone. The method can include generating audio output comprising the particular concurrent combination of distinct tones. The method can include transmitting the generated audio output to the endpoint.

In another respect, another method is disclosed. The method can include receiving audio content that comprises a concurrent combination of distinct tones. The method can include identifying, based on the received audio content: (i) respective frequencies of each of the distinct tones, and (ii) respective start times of each of the distinct tones. The method can include selecting a particular data value associated with the received audio content. The selection can be based at least in part on the identified frequencies and the identified start times. The method can include sending an indication of the selected particular data value.

In another respect, a system is disclosed. The system can include an encoder configured to: (i) receive a data value for transmission to an endpoint, and (ii) select a particular concurrent combination of a plurality of distinct tones based on the received data value. Each distinct tone in the plurality of distinct tones can have a respective frequency that is different than that of each other distinct tone, and each distinct tone in the plurality of distinct tones can have a respective starting time that is different than that of each other distinct tone. The system can include a tone generator configured to generate audio output comprising the particular concurrent combination of distinct tones. The system can include a transmitter configured to send the generated audio output to the endpoint.

Moreover, particular implementations of the present disclosure may include other examples for encoding and/or decoding digital data using combinations of audio tones with one or more modulated parameters. These as well as other aspects, advantages, and alternatives will become apparent to those of ordinary skill in the art by reading the following detailed description, with reference where appropriate to the accompanying drawings. Further, it should be understood that the description provided in this overview section and elsewhere in this document is provided by way of example only.

DETAILED DESCRIPTION

Together with the drawings, the foregoing description provides an example communication system in which the present disclosure can be implemented. It should be understood, however, that this and other arrangements described herein are set forth only as examples. As such, those skilled in the art will appreciate that other arrangements and elements (e.g., machines, interfaces, functions, orders, and groupings of functions, etc.) can be used instead, and that some elements may be omitted altogether. Further, many of the elements described herein are functional entities that may be implemented as discrete or distributed components or in conjunction with other components, and in any suitable combination and location. Various functions described herein as being performed by one or more entities may be carried out by hardware, firmware, and/or software. For instance, various functions may be carried out by a processor executing instructions stored in memory.

I. Example Communication System Architecture

Figure 1:
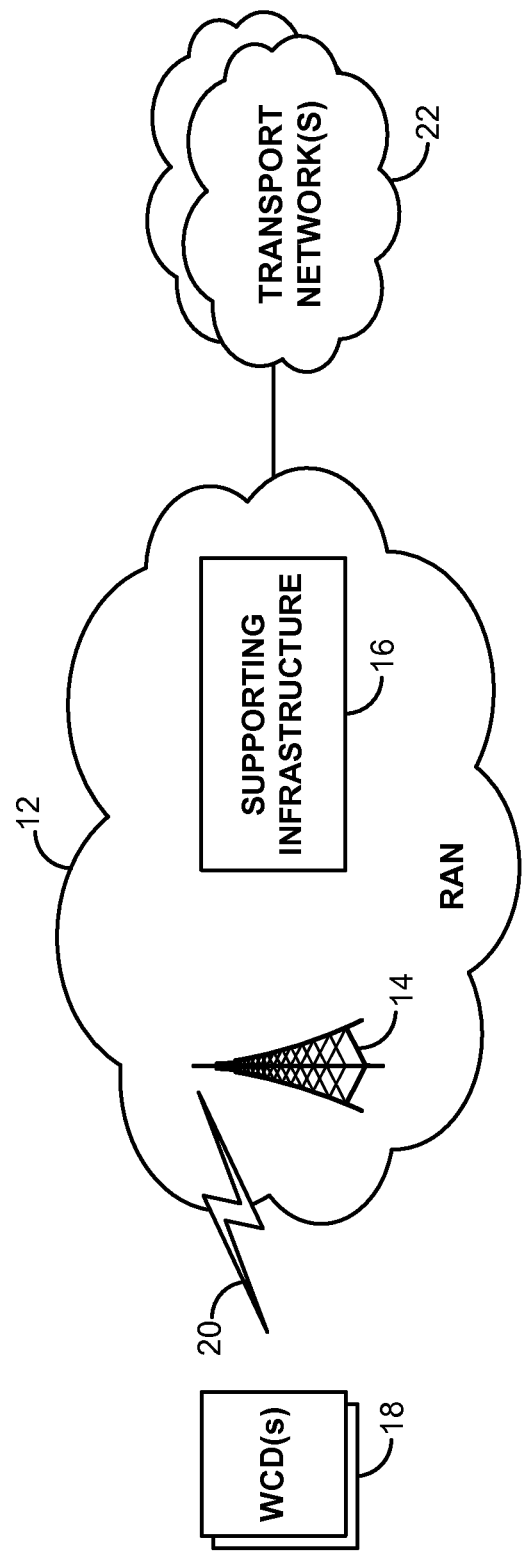
FIG. 1 is a simplified block diagram of an example wireless communication system in which the present disclosure can be implemented.

FIG. 1 depicts an example communication system that includes a radio access network (RAN) 12 having a representative base station 14 and supporting network infrastructure 16. The base station 14 includes antennas arranged to communicate with WCDs 18 in a coverage area over an air interface 20. RAN 12 then provides connectivity with one or more transport networks 22, such as the PSTN or the Internet for instance. With this arrangement, each WCD 18 that is in range of the base station 14 (i.e., in its coverage area) may register or attach with the RAN 12 and may engage in air interface communication with the base station 14 so as to communicate in turn with various remote entities on the transport network(s) 22 and/or with other WCDs served by the RAN 12.

Communications over the air interface 20 may involve radio frequency transmissions over carriers, the frequency and/or timing of which may be specified according to particular protocols. For instance, network resources over the air interface 20 may be scheduled in time-frequency segments that are allocated to particular WCDs 18 for communication with the base station 14 so as to avoid interference between different WCDs 18. Other examples of interface-specific protocols are conventions may also be used. Communications between the base station 14, network infrastructure 16, and/or transport networks 22 may also be carried out in accordance with particular protocols so as to avoid interference, allocate network resources, provide for formation of links, and related tasks and functions.

In practice, communications amongst the WCDs 18, the base station 14, the network infrastructure 16, and the transport networks 22 may involve sending and receiving analog signals modulated to represent digital data values. The various nodes in the communication system can include modems, which can be used to both output modulated analog signals that represent data values and also to demodulate incoming analog signals and thereby recover the represented data values. As described herein, such modems may be operated to encode data values in modulated chords and also to decode data values from modulated chords.

The wireless network communications system shown in FIG. 1 is provided for example purposes only, and example applications of the disclosed encoding/decoding scheme may find application in other communication systems as well.

II. Example Chord-Modulation Encoding and Decoding Systems

Figure 2A:
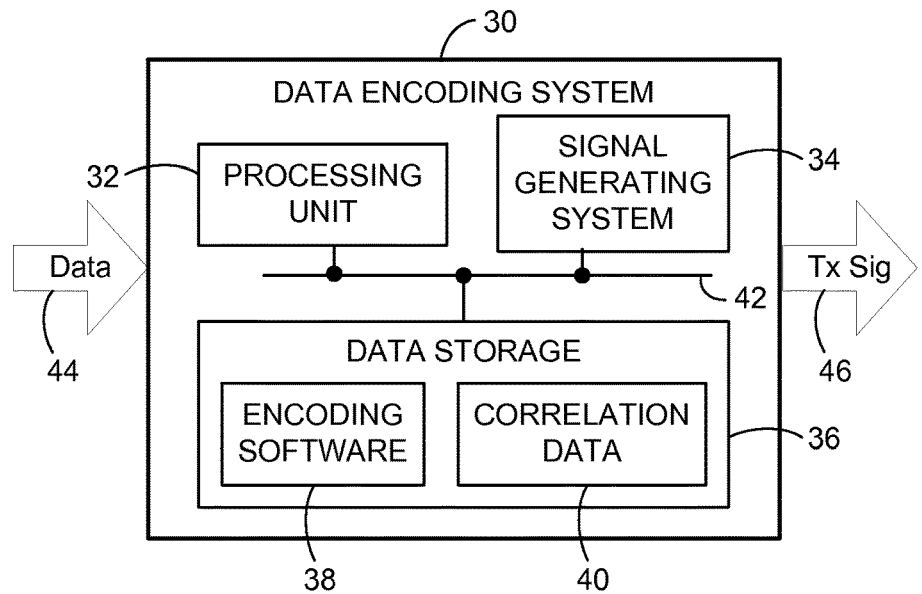
FIG. 2A is a simplified block diagram of an example data encoding system in which the present disclosure can be implemented.

FIG. 2A is a simplified block diagram of an example data encoding system 30 in which the present disclosure can be implemented. In particular, FIG. 2A illustrates functional components that might be found in a data encoding system in a network module configured to modulate chords to represent digital data values. In practice, the data encoding system 30 can receive a digital data value 44, select a chord that represents the data value (e.g., based on the modulated parameters of the chord), generate audio output including the chord, and output an analog signal 46 of the generated audio output. As shown, the data encoding system 30 may include a processing unit 32, a signal generation system 34, and data storage 36, all of which may be communicatively linked together by a system bus, or one or more other connection mechanisms 42.

The data storage 36 may include a non-transitory computer readable medium and includes encoding software 38 and correlation data 40. The encoding software 38 may include, for example, program logic that, when executed by the processing unit 32, cause the data encoding system 30 to function in accordance with the present disclosure. The correlation data 40 can include a data structure that associates each of various digital data values with respective modulated chords. The correlation data 40 may be implemented as a look-up table with indices corresponding to different possible values of modulated parameters (e.g., tone frequencies and tone starting times, and perhaps tone durations and amplitudes), and an entry at each unique combination of indices (i.e., unique combination of modulated parameters) providing a particular data value represented by those modulated parameters.

To receive the digital data value 44, the data encoding system 30 may also include (or operate in association with) wired and/or wireless communication interfaces for engaging in communication with other entities. For example, the data encoding system 30 may include (or be associated with) one or more network terminals, receivers, antennas, etc., which operate to convey an indication of the data value 44 to the data encoding system 30.

Upon receipt of the data value 44, the data encoding system 30 can select a particular modulated chord that represents the data value 44. The data encoding system 30 may, for example, refer to the correlation data 40, and select a particular chord (characterized by particular modulated parameters) that the correlation data 40 associates with the data value 44. The data encoding system 30 can thereby use the correlation data 40 to map the data value 44 to particular modulated parameters. The data encoding system 30 can then use the signal generating system 34 to generate audio output of the selected chord. In particular, the processing unit 32 can execute instructions in the encoding software 38, which cause the signal generating system 34 to generate each of the distinct tones in accordance with its respective modulated parameters, and thereby generate the selected chord. The analog signal 46 output from the data encoding system 30 can include the audio output of the generated chord and can be transmitted to another node in the communication network.

The generated chord can include multiple distinct tones output concurrently at respective specified frequencies and starting times. As used herein, the distinct tones in the chord are concurrent if the time intervals when each tone is output (i.e., time between respective starting times and ending times) at least partially overlap with one another. In addition, the chord can be configured such that each of the distinct tones is distinguishable from the others based on some convention. In one example, each tone in a given chord is distinguishable by each tone having a different starting time. For instance, the starting times of each tone can be delayed with respect to one another and the unique starting time of each tone can then be used to distinguish a given tone from every other tone in a chord (e.g., first starting time indicates first tone, second starting time indicates second tone, etc.). The result may be similar to the musical technique of an arpeggio or broken chord, in which individual notes (tones) of a chord are played in sequence, with the durations of the earliest played notes long enough to overlap with the initiation of the later played notes.

Other conventions may also be used to distinguish amongst distinct tones in a chord. In another example, each tone in a given chord may be distinguishable by another convention, such as respective ranges of frequencies indicating particular tones (e.g., a tone between frequencies $f_1$ and $f_2$ indicates a first tone, a frequency between $f_2$ and $f_3$ indicates a second tone, etc.). In another example, each tone may be distinguishable by an ordering of tone frequencies (e.g., lowest frequency indicates first tone, next lowest frequency indicates second tone, etc.).

As a result of the distinct tones being distinguishable from one another, the distinct tones (and the modulated parameters of each tone) can be separately identified. As a result, the quantity of uniquely identifiable chords (and thus the amount of data that can be represented by a given chord) scales exponentially with the number of distinguishable tones. For instance, the quantity of uniquely identifiable modulated chords may be given, at least approximately, by the number of unique combinations of different modulated parameters of each distinct tone, raised to the power of the number of distinct tones, as indicated by the relation below:

$$N\text{chords} = N\text{tone1} \times N\text{tone2} \times N\text{tone3},$$

where Nchords is the total number of uniquely identifiable chords, Ntone1 is the number of uniquely identifiable combinations of modulated parameters of a first tone, Ntone2 is the number of uniquely identifiable combinations of modulated parameters of a second tone, and Ntone3 is the number of uniquely identifiable combinations of modulated parameters of a third tone. And where Ntone≈Ntone1≈Ntone2≈Ntone3, then:

$$N\text{chords} \approx N\text{tone}^3.$$

By contrast, if each tone is not distinguishable, then the number of uniquely identifiable modulated chords may be given by the number of unique combinations of different modulated parameters of each distinct tone, multiplied by the number of tones. The difference in the number of uniquely identifiable chords is due to the lack of differentiation between tones (e.g., it is not possible to know which tone is "first," and which is "second," only that two tones are present with particular parameters). In such an arrangement, the number of uniquely identifiable chords may be given, at least approximately, by the relation below:

$$N\text{chords} \approx N\text{tone1} + N\text{tone2} + N\text{tone3} \approx 3N\text{tone}.$$

However, the number of uniquely identifiable chords may also be influenced by a requirement that each tone have a different frequency, for example, or perhaps another requirement that limits the mutual independence between the modulated parameters of different tones.

The signal generating system 34 can be configured to create audio output analog signals (e.g., signals between about 20 hertz and about 20 kilohertz). The signal generating system 34 may include one or more tone generators, such as oscillators or the like, capable of outputting analog electrical signals of audio tones modulated according to specified parameters (e.g., a combination of tone frequency, tone duration, and/or amplitude). The signal generating system may also include a synthesizer or another waveform generator configured to output a waveform of a given chord in accordance with specified modulated parameters. In some cases, to create the distinct tones, the signal generating system 34 may operate by creating multiple sinusoidal waveforms concurrently, with each sinusoidal waveform having a respective starting time and frequency specified by the modulated parameters. The distinct waveforms may then be independently amplified (to set the amplitudes of each tone) and superimposed to create a waveform of the modulated chord. The modulated parameters may also specify durations of the generated tones (and thus ending times of each sinusoidal waveform).

In one example, the signal generating system 34 may include one or more physical instruments configured to generate sound waves of one or more distinct tones. For instance, resonant cavities and/or strings can be driven to vibrate so as to create sound waves of particular tones. Sound from such tone-generating instruments can then be converted to analog electrical signals by a suitable transducer, such as a microphone.

In practice, the analog signal 46 of the generated chord output from the encoding system 30 can be transmitted over a communication channel. In some cases, the transmission may be performed by mixing the analog signal 46 with a carrier frequency and using a transmitter to send the resulting signal to another communicatively coupled network location. The communication channel may take a variety of different forms, and may include links implemented with sonic, wireless, and/or wireline links configured to convey analog signals between nodes in a network.

In addition, the signal generating system 34 can be configured to generate a reference tone having a standard frequency and/or standard amplitude. Such a reference tone may be output simultaneously with the selected chord and included in the analog audio output. The standard amplitude of the reference tone can then be used as a basis for comparison when estimating the respective amplitudes of the distinct tones in the transmitted chord. In some cases, the standard amplitude and/or standard frequency can be used to calibrate amplitude detectors on the receive end, and thereby account for effects of variable noise or other signal degrading factors along the communication channel. In some cases, the amplitudes of distinct tones can be measured relative to the standard amplitude (e.g., by estimating a difference in amplitude between the standard amplitude and the amplitudes of the distinct tones). In addition, the standard frequency of the reference tone can be used as a basis of comparison when estimating the respective frequencies of the distinct tones. Further still, the reference tone can be used as an indicator that a chord is being simultaneously transmitted. That is, the reference tone may be used to initiate a modulated chord symbol time, and recipient nodes can use the reference tone to begin detecting and characterizing distinct tones in the simultaneously received chord. In another example, the starting time and/or ending time of the reference tone may be used as reference time(s) from which to measure the starting times and/or durations of the distinct tones using timers.

In some cases, the data encoding system 30 can be configured to generate chords such that the individual tones in the chord each span a narrow band of frequency with limited harmonic distortions. Using such pure tones (e.g., substantially sinusoidal waveforms), allow the distinct tones in the chord to have substantially non-overlapping frequency domains and thereby avoid interference with one another. In addition, the individual tone frequencies, and perhaps the frequency of the reference tone, can be selected from tones that are not harmonically related to one another. As such, when the analog signal including the modulated chord is received, the individual tones can be isolated and then independently analyzed and characterized to identify the modulated parameter(s) characterizing each tone. For instance, individual narrow band filters for each possible tone frequency can be used to isolate the contributions at each tone frequency. The outputs from the filters can then be separately analyzed to determine whether a tone is present at that frequency, and, if so, identify the modulated parameters of that tone (e.g., starting time, amplitude, duration). As described next, such filtering and signal analysis may be implemented digitally (e.g., the voltage of the received waveform can be sampled at a sampling frequency and the sampled waveform can be analyzed using digital signal processing techniques) and/or using hardware-implemented or firmware-implemented functional modules.

Moreover, the frequency domain of possible distinct tones in a chord can be selected from amongst a set of distinct frequencies that do not harmonically interfere with one another. Such a set of substantially harmonically unrelated frequencies can then define a first channel for transmission of modulated chords on a given carrier. In some cases, a second set of substantially harmonically unrelated frequencies can define a second channel on the same carrier. The first set and the second set can be selected such that no frequency multiples or other harmonically related frequencies exist amongst the combined group. Thus, a first chord on the first channel (having tone frequencies selected from the first set) do not harmonically interfere with a second chord on the second channel (having tone frequencies selected from the second set). As such, multiple modulated chords can be transmitted simultaneously over the same carrier. In some embodiments, harmonically unrelated channels can be used to provide full duplex communications between respective nodes over the same carrier channel. In addition to providing full duplex communication links, harmonically unrelated sets of frequencies can also be used for other purposes to allow modulated chords to be simultaneously sent over a common carrier channel.

Figure 2B:
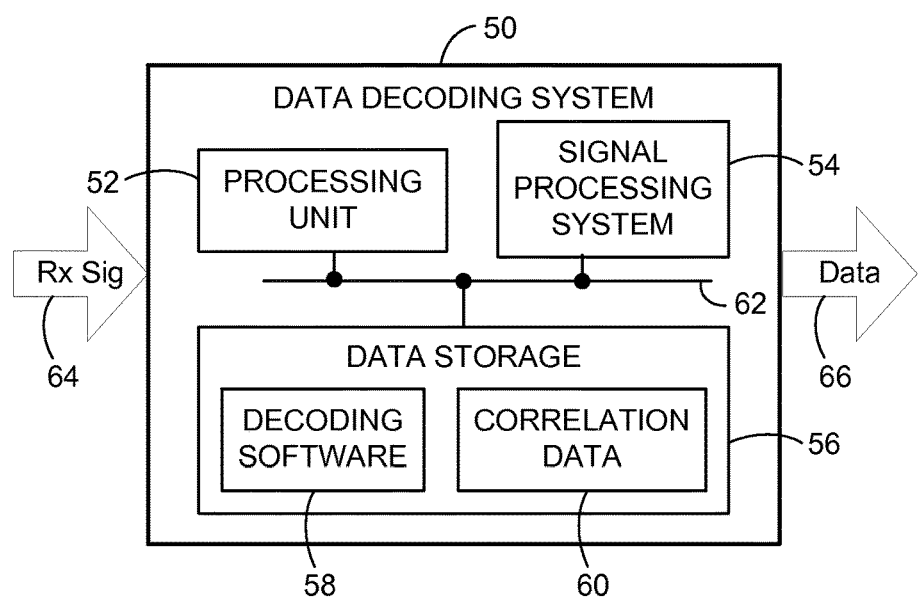
FIG. 2B is a simplified block diagram of an example data decoding system in which the present disclosure can be implemented.

FIG. 2B is a simplified block diagram of an example data decoding system 50 in which the present disclosure can be implemented. In particular, FIG. 2B illustrates functional components that might be found in a data decoding system in a network module configured to demodulate chords representing digital data values. In practice, the data encoding system 30 can receive an analog signal 64 including an audio chord, identify modulated parameters of the chord, select a digital data value represented by the chord (e.g., based on the identified modulated parameters), and output the selected digital data value 66. As shown, the data decoding system 50 may include a processing unit 52, a signal processing system 54, and data storage 56, all of which may be communicatively linked together by a system bus, or one or more other connection mechanisms 62.

The data storage 56 may include a non-transitory computer readable medium and includes decoding software 58 and correlation data 60. The decoding software 58 may include, for example, program logic that, when executed by the processing unit 52, causes the data decoding system 50 to function in accordance with the present disclosure. The correlation data 60 can include a data structure that associates each of various digital data values with respective modulated chords, similar to the correlation data 40. In addition, the data decoding system 50 may include one or more communication interfaces for sending and receiving indications of digital data and/or analog signals between nodes in a communicatively coupled network.

The signal processing system 54 can be configured to analyze audio signals (e.g., signals between about 20 hertz and about 20 kilohertz) and identify modulated parameters of a chord included in the audio signal. The signal processing system 54 may include (or be associated with) a receiver that converts incoming analog signals to baseband, and perhaps filters, amplifies or otherwise conditions the audio signals for further analysis. The analog signal may be sampled and the waveform data can be analyzed using digital signal processing techniques to identify the modulated parameters of the chord. In some cases, the signal processing system 54 may also include a bank of narrow band filters each tuned to a particular tone frequency that isolates the contributions to the chord at each tone frequency. Generally, the sampling frequency and/or resolution/precision of the measured voltage values (e.g., via analog to digital converters) can be selected to allow for sufficient resolution in estimating the various modulated parameters of the received chord.

Based on the received chord, the signal processing system 54 can identify which of the possible tone frequencies include tones, and estimate the starting times of each of those tones. The signal processing system 54 may also estimate the amplitudes and/or durations of each tone. The starting times and durations may be estimated using, for example, timers and frequency-specific signal strength detectors that combine to indicate the absolute and/or relative times at which each tone is first detected (i.e., the respective starting times) and the times at which each tone stops being detected (i.e., the respective ending times). The duration of a given tone can then be estimated based on the difference between the starting time and ending time of the given tone. The amplitude can be estimated based on, for example, an average measurement of received power at a given tone frequency between the starting time and ending time of the tone, or perhaps another indicator of frequency-specific signal strength. A variety of different hardware-implemented and/or software-implemented techniques can be employed to obtain estimates of the modulated parameters of the received audio content using the signal processing system 54.

Once the modulated parameters of the received analog signal 64 are identified, the data decoding system 50 can then map the modulated parameters to a particular data value. For example, the processing unit 52 may execute instructions stored in the decoding software 58, which cause the data decoding system 50 to refer to the correlation data 60 and select a particular data value indicated therein that is associated with the set of particular modulated parameters identified using the signal processing system 54. The correlation data 60 can thereby be used to map the identified modulated parameters to a particular data value. An indication of the selected digital data value 66 can then be output from the data decoding system 50 for further processing.

In some cases, the received analog signal 64 may include a reference tone in addition to a modulated chord. The reference tone can be a tone with a reserved, predetermined frequency and a standard amplitude that is used as a basis for comparison in estimating the modulated parameters of the chord. Because the reference tone is delivered over the same communication channel as the modulated chord, the standard amplitude can be used to account for variations in noise or other signal degrading effects along the communication channel. For example, the values of the modulated amplitudes can be determined relative to the standard amplitude. The modulated amplitudes may be estimated as respective fractions of the standard amplitude, for example. In another example, the standard amplitude may be used to calibrate the amplitude estimation process by setting a maximum value (or another standard reference value) from which the other modulated amplitudes can be compared. As noted above, the starting and ending times of the reference tone can also be used as a basis for comparison in estimating the respective starting times and/or durations of the distinct tones.

In practice, the data encoding system 30 and data decoding system 50 may be implemented in a single device configured to both output modulated chords that represent data values input to the device and also output data values represented by modulated chords input to the device. Such a modulation/demodulation device can thus be used to interface between digital data values and analog signals used to represent those values for purposes of communication between nodes in a communication network. For example, with reference to FIG. 1, a modulation/demodulation device that includes the functionality of data encoding system 30 and data decoding system 50 could be incorporated into a WCD (e.g., any of WCDs 18), into one or more elements of RAN 12, and/or into any entity on transport network(s) 22 with which a WCD may communicate.

III. Example Operations

Figure 3:
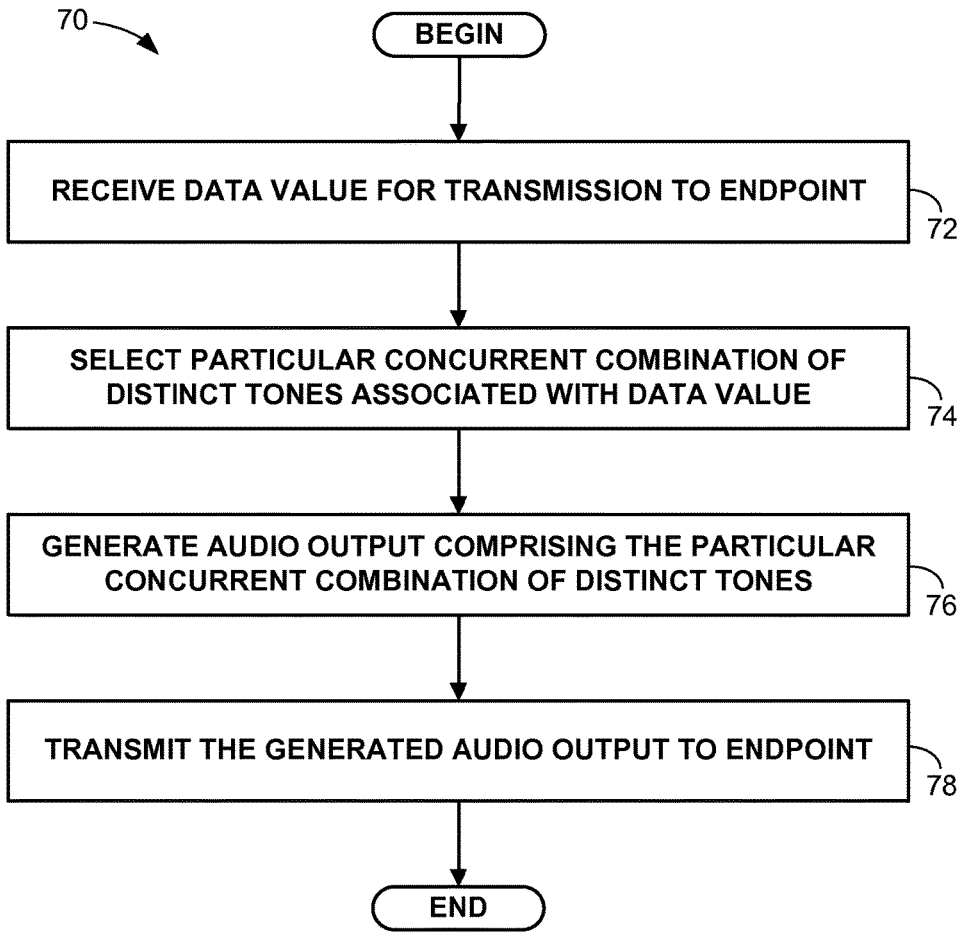
FIG. 3 is a flow chart depicting a process that can be carried out by a data encoding system in accordance with an example method.

FIG. 3 is a flow chart depicting a process 70 that can be carried out by a data encoding system in accordance with an example method. The process 70 is described from the perspective of an example data encoding system generating a modulated chord to represent a data value. In some cases, the process 70 may be performed by the data encoding system 30 described in connection with FIG. 2A. At block 72, the data encoding system receives a data value for transmission to an endpoint. For example, the data encoding system may receive an indication of a digital data value via a communication terminal. At block 74, the data encoding system selects a particular concurrent combination of distinct tones associated with the data value. For example, the selection may be made on the basis of correlation data maintained by the data encoding system, which correlation data maps various data values to respective chords characterized by modulated parameters. In some cases, the selected chord is characterized by parameters that specify, at least, respective frequencies and respective starting times of each of the distinct tones. In addition, the selected chord may be further characterized by parameters that specify respective amplitudes and/or respective durations of each of the distinct tones.

At block 76, the data encoding system can generate audio output including the particular concurrent combination of distinct tones. As noted above, the audio output may be generated using a signal generating system, which may include a waveform generator, a synthesizer, or another device configured to generate analog electric signals of pure tones with particular frequencies, starting times, and perhaps amplitudes and durations. For example, the signal generating system 34 may be configured to output the analog signal having particular modulated parameters based on instructions generated using the processor 32 while executing the program instructions in the encoding software 38. At block 78, the data encoding system (alone or in coordination with a transmission system) can transmit the generated audio output to the endpoint. For example, the generated audio output may be mixed with a carrier frequency and transmitted over a communication channel in accordance with a particular communication protocol, such as a communication protocol employed in a wireless communication network.

Figure 4:
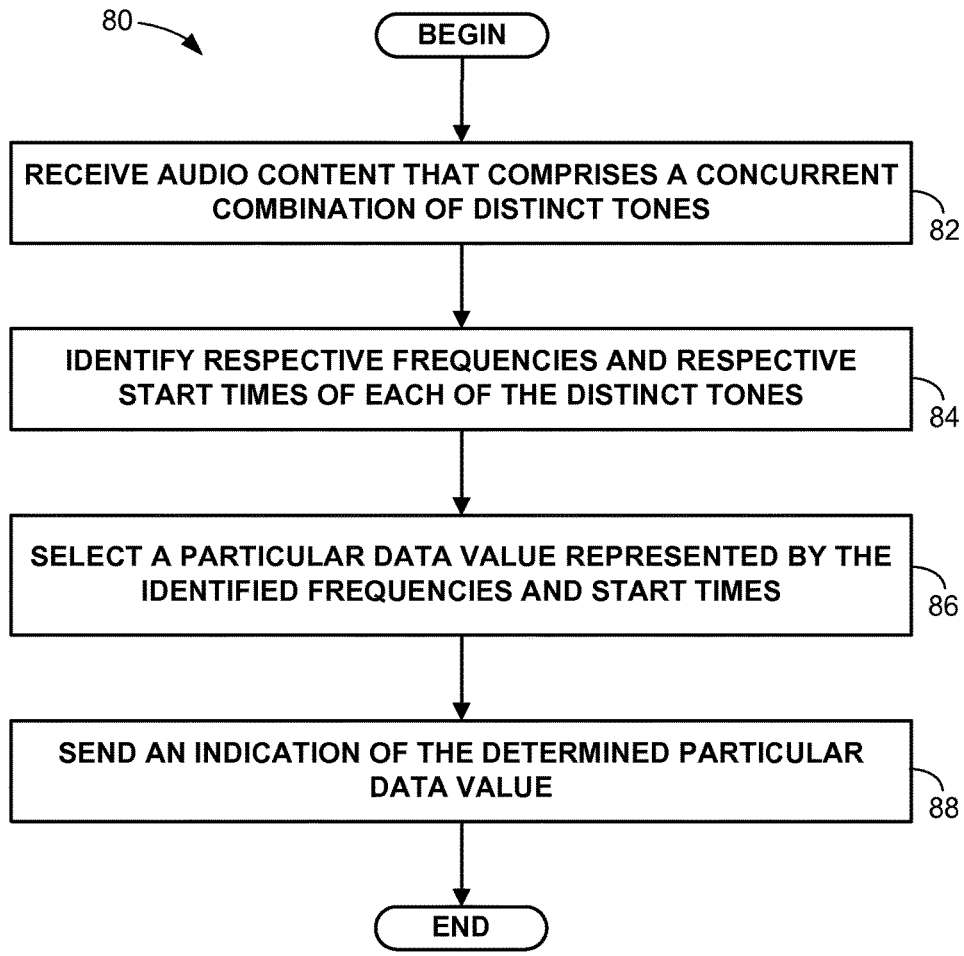
FIG. 4 is another flow chart depicting a process that can be carried out by a data decoding system in accordance with an example method.

FIG. 4 is another flow chart depicting a process 80 that can be carried out by a data decoding system in accordance with an example method. The process 80 is described from the perspective of an example data decoding system determining a particular data value represented by a received chord. In some cases, the process 80 may be performed by the data decoding system 50 described in connection with FIG. 2B. At block 82, the data decoding system receives audio content including a concurrent combination of distinct tones. For example, the data decoding system may receive an analog signal including a modulated chord. At block 84, the data decoding system identifies respective frequencies and respective starting times of each of the distinct tones. For example, the data decoding system may include a signal processing system and/or receiver that coordinate to convert the received analog signal to baseband, filter, amplify, and otherwise condition the signal, and then sample the conditioned waveform to perform further analysis using digital signal processing techniques.

In some examples, contributions at each of the possible tone frequencies can be isolated using narrow band filters centered on the possible tone frequencies. The output from such a tone-specific filter can be used to determine whether the chord includes a tone having the frequency corresponding to that filter (e.g., if the output signal from such a filter exceeds a threshold value). Moreover, the starting time of each tone can be determined based on the times at which the tones having each frequency are first detected. In addition, as described above, the received chord may be modulated based on the amplitudes and durations of each of the distinct tones, and block 84 may involve identifying those values as well.

The identification of the various modulated parameters (e.g., frequencies, starting times, etc.) may further be based on a received reference tone included in the analog signal along with the chord and used as a basis for comparison to account for variations in noise and/or signal degradation along the communication channel. For instance, the reference tone can have a standard amplitude that is used as a basis for comparison in determining the amplitudes of the distinct tones.

At block 86, the data decoding system selects a particular data value represented by the identified frequencies and starting times. For example, the selection may be made on the basis of correlation data maintained by the data encoding system, which correlation data maps various data values to respective chords characterized by modulated parameters. At block 88, the data decoding system can send an indication of the determined particular data value.

Example embodiments have been described above. It should be understood, however, that variations from these embodiments are possible, while remaining within the true spirit and scope of the disclosure.

We claim:

1. A method comprising:
receiving a data value for transmission to an endpoint;
selecting a particular concurrent combination of a plurality of distinct tones based on the received data value, wherein each distinct tone in the plurality of distinct tones is a distinct audio tone, wherein each distinct tone in the plurality of distinct tones has a respective frequency that is different than that of each other distinct tone, and wherein each distinct tone in the plurality of distinct tones has a respective starting time that is different than that of each other distinct tone such that there are portions of each distinct tone that overlap with each other and at least one portion of one of the distinct tones that does not overlap with any portion of any other of the distinct tones;
generating a reference tone having a standard amplitude, the reference tone indicating a duration of each distinct audio tone in the particular concurrent combination of distinct tones;
generating audio output comprising the particular concurrent combination of distinct tones; and
transmitting the generated audio output to the endpoint.

2. The method of claim 1, further comprising:
selecting, based on the received data value, respective amplitudes for each of the distinct tones; and
wherein generating the audio output comprises generating each of the distinct tones with its respective selected amplitude.

3. The method of claim 1, further comprising:
selecting, based on the received data value, respective durations for each of the distinct tones; and
wherein generating the audio output comprises generating each of the distinct tones for its respective selected duration.

4. The method of claim 1, further comprising:
transmitting the reference tone and the particular concurrent combination of distinct tones to the endpoint simultaneously.

5. The method of claim 4, wherein each of the distinct tones and the reference tone have frequencies configured to avoid harmonic interference with one another.

6. The method of claim 1, wherein the particular concurrent combination of distinct tones comprises at least three distinct tones.

7. The method of claim 1, further comprising:
maintaining in data storage correlation data that associates each of multiple data values with a respective concurrent combination of distinct tones; and
wherein selecting the particular concurrent combination of distinct tones based on the received data value comprises referring to the correlation data and mapping the received data value, on the basis of the correlation data, to the particular concurrent combination of distinct tones.

8. The method of claim 7, wherein, for each given data value of the multiple data values, the correlation data further associates the given data value with respective amplitudes and respective durations of the distinct tones in the concurrent combination associated with the given data value, the method further comprising:
selecting, based on the correlation data, respective amplitudes and respective durations for each of the distinct tones in the particular concurrent combination; and
wherein generating the audio output comprises, for each of the distinct tones in the particular concurrent combination, generating the distinct tone in accordance with its respective start time, its respective frequency, its respective amplitude, and its respective duration.

9. The method of claim 8, wherein the particular concurrent combination comprises at least three distinct tones.

10. A method comprising:
receiving audio content that comprises a concurrent combination of distinct tones and a reference tone, wherein each distinct tone in the concurrent combination of distinct tones is a distinct audio tone, wherein the concurrent combination of distinct tones is such that there are portions of each distinct tone that overlap with each other and at least one portion of one of the distinct tones that does not overlap with any portion of any other of the distinct tones, and wherein the reference tone indicates a duration of each distinct audio tone in the concurrent combination of distinct tones;

identifying, based on the received audio content: (i) respective frequencies of each of the distinct tones, and (ii) respective start times of each of the distinct tones;

selecting a particular data value associated with the received audio content, wherein the selection is based at least in part on the identified frequencies and the identified start times; and sending an indication of the selected particular data value.

11. The method of claim 10, further comprising:

identifying, based on the received audio content, respective amplitudes of each of the distinct tones; and wherein the selection of the particular data value is further based on the identified amplitudes.

12. The method of claim 11, further comprising:

for each of the distinct tones, determining a respective difference in amplitude between the distinct tone and the reference tone; and wherein identifying the respective amplitudes of the distinct tones is based on the determined differences in amplitude.

13. The method of claim 10, further comprising:

identifying, based on the received audio content, respective durations of each of the distinct tones; and wherein the selection of the particular data value is further based on the identified durations.

14. The method of claim 10, wherein the concurrent combination of distinct tones comprises at least three distinct tones.

15. The method of claim 10, further comprising:

maintaining in data storage correlation data that associates each of multiple data values with a respective concurrent combination of distinct tones, wherein the correlation data characterizes each concurrent combination of distinct tones, at least in part, by respective frequencies and respective start times for each distinct tone; and wherein selecting the particular data value associated with the received audio content comprises referring to the correlation data and mapping the identified frequencies and identified start times, on the basis of the correlation data, to the particular data value.

16. The method of claim 15, wherein the correlation data further characterizes each concurrent combination of distinct tones by respective amplitudes and respective durations for each distinct tone, the method further comprising:

identifying, based on the received audio content, respective amplitudes and respective durations of each of the distinct tones; and wherein the selection of the particular data value is further based on the identified amplitudes and durations.

17. A system comprising:

an encoder configured to: (i) receive a data value for transmission to an endpoint, and (ii) select a particular concurrent combination of a plurality of distinct tones based on the received data value, wherein each distinct tone in the plurality of distinct tones is a distinct audio tone, wherein each distinct tone in the plurality of distinct tones has a respective frequency that is different than that of each other distinct tone, and wherein each distinct tone in the plurality of distinct tones has a respective starting time that is different than that of each other distinct tone such that there are portions of each distinct tone that overlap with each other and at least one portion of one of the distinct tones that does not overlap with any portion of any other of the distinct tones;

a tone generator configured to generate audio output comprising the particular concurrent combination of distinct tones, wherein the tone generator is further configured to generate a reference tone having a standard amplitude, the reference tone indicating a duration of each distinct audio tone in the concurrent combination of distinct tones; and a transmitter configured to send the generated audio output to the endpoint.

18. The system of claim 17, wherein the transmitter is further configured to send the reference tone and the generated audio output to the endpoint simultaneously.

19. The system of claim 17, further comprising:

data storage that stores correlation data that associates each of multiple data values with a respective concurrent combination of distinct tones, and wherein the encoder is configured to select the particular concurrent combination of distinct tones by referring to the correlation data and mapping the received data value to the particular concurrent combination based on the correlation data.

20. The system of claim 17, wherein the particular concurrent combination comprises at least three distinct tones.

* * * * *